(12) United States Patent
Yazawa et al.

(10) Patent No.: US 6,739,638 B1
(45) Date of Patent: May 25, 2004

(54) WORK TRANSFER DEVICE

(75) Inventors: Takayuki Yazawa, Nagano (JP); Kenichi Shirotori, Nagano (JP)

(73) Assignee: Kabushiki Kaisha Sankyo Seiki Seisakusho, Nagano (JP)

( * ) Notice: Subject to any disclaimer, the term of this patent is extended or adjusted under 35 U.S.C. 154(b) by 56 days.

(21) Appl. No.: 10/031,881

(22) PCT Filed: Aug. 4, 2000

(86) PCT No.: PCT/JP00/05263

§ 371 (c)(1),
(2), (4) Date: Jan. 25, 2002

(87) PCT Pub. No.: WO01/10608

PCT Pub. Date: Feb. 15, 2001

(30) Foreign Application Priority Data

Aug. 4, 1999 (JP) .......................................... 11-221353

(51) Int. Cl.[7] ............................................... B25J 15/06
(52) U.S. Cl. ...................... 294/64.1; 414/752.1; 901/40
(58) Field of Search ............................. 414/744.5, 737, 414/752.1; 901/40, 30; 294/64.1

(56) References Cited

U.S. PATENT DOCUMENTS 5,622,400 A * 4/1997 George ...................... 294/64.1

FOREIGN PATENT DOCUMENTS

| JP | 05228873 | 9/1993 |
|---|---|---|
| JP | 11163093 | 6/1999 |
| JP | 11188681 | 7/1999 |

OTHER PUBLICATIONS

International Search Report, PCT/JP00/05263, Oct. 31, 2000.

* cited by examiner

Primary Examiner—Donald W. Underwood
(74) Attorney, Agent, or Firm—Notaro & Michalos P.C.

(57) ABSTRACT

Relating to improvement in a hand of an apparatus for taking out a workpiece such as liquid crystal glass from a cassette and carrying it to a predetermined position, and aiming at reducing a weight of an arm portion for holding the liquid crystal glass and a quantity of deflection. A workpiece holding portion of the hand for holding a workpiece such as liquid crystal glass is formed by a horizontal holding arm (5) extending in the horizontal direction and consisting of a carbon fiber material, the horizontal holding arm (5) has a horizontal arm portion (7) opposed to the workpiece and at least one bent portion (6) being bent in a direction crossing the horizontal arm portion (7), and a surface of a corner portion (5d) on the border between the bent portion (6) and the horizontal arm portion (7) is rounded.

7 Claims, 9 Drawing Sheets

Fig. 7

| conditions of glass substrate | aluminium flat bar | CFRP top hat shape |
|---|---|---|
| width of substrate W (mm) | 590 | 590 |
| depth of substrate d (mm) | 670 | 670 |
| thickness of substrate t (mm) | 0.7 | 0.7 |
| specific gravity of substrate (kg/mm$^3$) | 2.70E-06 | 2.70E-06 |
| mass of substrate Mg (kg) | 7.47E-01 | 7.47E-01 |
| condition of concentrated load | | |
| concentrated load P1 | 3.74E-01 | 3.74E-01 |
| concentrated load P2 | | |
| distance L1 to concentrated load P1 | 590 | 590 |
| distance L2 to concentrated load P1 | | |
| hand dimension | angular cross section | bent structure |
| width b (mm) | 56 | |
| thickness t (mm) | 10 | |
| length L0 (mm) | 890 | 890 |
| Young's modulus E (kgf/mm$^2$) | 7000 | 18000 |
| density (kg/mm$^3$) | 2.70E-06 | 1.70E-06 |
| mass of hand Mh (kg) | 1.346 | 2.12E-01 |
| geometrical moment of inertia I | 4.667E+03 | 1913 |
| 1/12·(b·h$^3$) | | |
| deflection by own weight (mm) | 3.630 | 0.542 |
| 1/8·(Mg·10$^3$)/(E·I) | | |
| deflection of mass of substrate (mm) | 1.379970841 | 1.309143505 |
| 1/6·{(P1·L1$^2$)·(3L0 − L1)+1/6·(P2·L2$^2$)·(3L0 − L2)}/(E·I) | | |
| total deflection at the end of hand | 5.010 | 1.851 |
| from the end of hand to the end of substrate (protruded length) L3 | 35 | 35 |
| deflection at the end of substrate | 5.011273473 | 1.852372112 |
| L3·sin{(1/2/E/I·(P1·L1$^2$+P2·L2$^2$+Mh·L0$^2$/3/E/I)} | | |
| glass deflection of protruded portion of substrate | 1.65E-03 | 1.65E-03 |
| total deflection at the end of substrate | 5.01E+00 | 1.85E+00 |

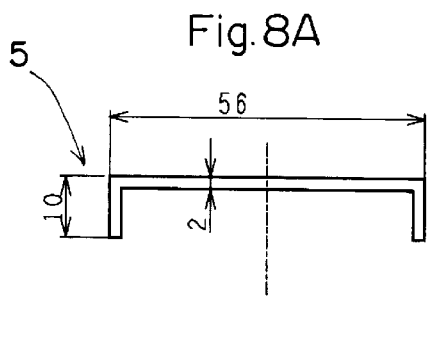
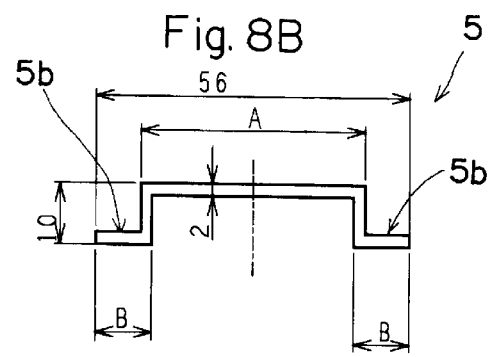
Fig. 8C
| A:2B | 1:0 | 2:1 | 1:1 | 1:2 |
|---|---|---|---|---|
| Figure NO | 8 A | 8 B | 8 B | 8 B |
| Area ($mm^2$) | 144 | ← | ← | ← |
| Geometrical moment of inertia in up and down directions ($mm^4$) | 830 | 1854 | 2032 | 1854 |
| Ratio when assuming 1:1 as 1 | 0.4 | 0.9 | 1 | 0.9 |

WORK TRANSFER DEVICE

TECHNICAL FIELD

The present invention relates to a workpiece carrying apparatus. More particularly, the present invention relates to improvement in a shape or a material of an apparatus for taking out a workpiece such as liquid crystal glass from a cassette and carrying it to a predetermined position.

BACKGROUND ART

A workpiece carrying apparatus 101 for carrying a workpiece such as liquid crystal glass has, for example, a base 102, a first arm 103, a second arm 104 and a hand 105 as shown in FIG. 13. In this case, as a portion of the hand 105 for holding a workpiece (which will be simply referred to as a workpiece holding portion 105 hereinafter), a thin and elongated one which can carry a relatively large workpiece 106, enter a gap between the workpieces 106 piled up in the multilayer form at a narrow accommodation pitch and take out such a workpiece is preferable. Further, it is important that the workpiece holding portion 105 has the sufficient rigidity for reducing the deflection when holding the workpiece 106 and it is formed to be lightweight.

As such a workpiece holding portion 105, there is a flat bar obtained by, e.g., scraping off an aluminium material or carbon and molding it. As things stand now, as a material of the workpiece holding portion 105, aluminium or carbon mentioned above, stainless steel or ceramics is used to intend reduction in weight and provide the sufficient strength.

In recent years, however, with increase in size of the workpiece 106, the size of the workpiece holding portion 105 of the workpiece carrying apparatus 101 is also increased, and increase in weight of the workpiece holding portion 105 or the deflection involved by this increase becomes a problem. When the workpiece holding portion 105 is deflected in this manner, the workpiece 106 can not be safely and securely inserted or removed unless the accommodation pitch of the workpiece 106 in the cassette is increased. Furthermore, since the rectilinear movement property at the time of inserting or taking out the workpiece holding portion 105 is deteriorated because of the deflection, a moving velocity must be reduced, thereby prolonging the tact time required for carrying the workpiece 106. Moreover, the inertia also becomes large when the weight of the workpiece holding portion 105 is increased, and increasing an output for driving the workpiece holding portion 105 may result in enlargement of the dimension of the entire apparatus.

In addition, the workpiece holding portion 105 of the workpiece carrying apparatus 101 must have the structure for sucking the workpiece 106, i.e., a pad, a rubber material, a pipe, a sensor cable and others. It is required to accommodate these members while obtaining the thin shape as a whole. As such a thin workpiece holding portion 105, there is one having, e.g., a rectangular cross section. However, since such a workpiece holding portion 105 is formed by scraping off a solid-core material, the workpiece holding portion 105 itself has the solid-core structure. Thus, when the workpiece holding portion 105 is formed to be long in the longitudinal direction, the workpiece holding portion 105 may be deflected downwards by action of the uniformly distributed load by its own weight. In this case, a quantity of deflection becomes maximum at the end of the workpiece holding portion 105. Additionally, if its influence is considerable, the accuracy for inserting the workpiece holding portion 105 between the workpieces 106 is lowered.

It is, therefore, an object of the present invention is to provide a workpiece carrying apparatus which can be formed long while suppressing increase in weight of a workpiece holding portion for holding a workpiece, and which has the rigidity bearing off elongation. That is, it is an object of the present invention to form the workpiece holding portion as a long product which is lightweight and hardly deflected.

DISCLOSURE OF INVENTION

To achieve this aim, according to the present invention, there is provided a workpiece carrying apparatus comprising a hand for holding a workpiece and a moving mechanism for moving the hand in the horizontal direction, wherein a workpiece holding portion of the hand is formed by a horizontal holding arm which is extended in the horizontal direction and consists of a carbon fiber material, the horizontal holding arm has a horizontal arm portion opposed to a workpiece and at least one bent portion bent in a direction crossing the horizontal arm portion, and the surface of a corner portion on the border between the bent portion and the horizontal arm portion is rounded.

In this case, the horizontal holding arm is originally molded in shape such that a plate-like member is bent. As a result, a space is formed in a concave portion having a bent shape, and members required for sucking a workpiece are accommodated in this space. Therefore, the horizontal holding arm can be formed thin and compact as a whole while accommodating the respective members. Furthermore, when the plate-like member has the bent shape, the high flexural rigidity can be obtained. Moreover, in the present invention, since this horizontal holding arm is constituted by a carbon fiber material, the weight can be reduced and the high rigidity can be obtained. According to the present invention, the workpiece holding portion of the hand can be elongated while suppressing increase in weight, and the rigidity bearing off elongation is provided. Thus, a quantity of deflection when holding a workpiece is small, and a workpiece accommodated with a narrow pitch can be rapidly and assuredly carried.

In addition, since the surface of the bent portion on the workpiece side is rounded, interference hardly occurs even if the held workpiece is curved. Even if the workpiece is brought into contact with the bent portion, the surface of the workpiece is prevented from being damaged, and the static electricity is rarely generated to the liquid crystal glass as a workpiece.

According to the present invention, the horizontal holding arm is provided with the bent portions on both sides of the horizontal arm portion in the workpiece carrying apparatus, as described previously. In this case, the geometrical moment of inertia can be increased, and the flexural rigidity which is high for a cross sectional area can be obtained. When the horizontal arm portion is caused to be orthogonal to the bent portion in particular, the geometrical moment of inertia can be further increased.

Furthermore, when a space is formed on the back side of the horizontal arm portion and used so that the members and others required for suction can be accommodated in this space, a thin and compact workpiece holding portion can be formed.

According to the present invention, the horizontal holding arm is provided with a flange portion which is bent on the opposite side to the horizontal arm potion of the bent portion in the workpiece carrying apparatus as described above. In this case, the geometrical moment of inertia can be further increased, and the high flexural rigidity can be obtained. Moreover, since the flange portion is formed at least on one side of the horizontal holding arm, the geometrical moment of inertia can be further increased and the high flexural rigidity can be obtained.

According to the present invention, the flange portion is bent outward in the workpiece carrying apparatus described above. In this case, the horizontal holding arm has a crank-like or Z-shaped cross section formed by the horizontal arm portion, the bent portion and the flange portion, and the high geometrical moment of inertia can be obtained.

According tot he present Invention, the horizontal holding arm has a transverse cross section which is hollow elliptical. When the closed shape is used in this manner, the cross-sectional shape is hardly deformed, and a quantity of deflection at the end of the horizontal holding arm constituting the workpiece holding portion is small. Therefore, this is preferable as a large workpiece carrying apparatus in which the work holding portion is elongated.

According to the present invention, a suction portion for sucking a workpiece is caused to protrude on the front surface side of the horizontal arm portion and a holding mechanism for holding the suction portion and a pipe for suction are accommodated on the back surface side of the horizontal arm portion in the workpiece carrying apparatus as above. According to this apparatus, a workpiece can be carried while being sucked, and it is possible to form the thin work piece holding portion having the compact shape in which the holding mechanism and others are accommodated.

According to the present invention, the holding mechanism is accommodated in a space consisting of a concave portion formed between the horizontal arm portion and hte bent portion on the back surface side of the horizontal arm portion in the workpiece carrying apparatus as described above. When, e.g., taking out a workpiece, therefore, even if the workpiece is brought into contact with the back surface side of the horizontal holding arm, the surface of the workpiece can be prevented from being damaged by the holding mechanism.

According to the present invention, a workpiece is a laminated plate material, the horizontal arm portion includes a plurality of suction portions, and the laminated plate material is sucked and held by a plurality of the suction portions in the workpiece carrying apparatus as described above. Therefore, the plate material can be stably carried, and it is possible to cope with a plate material such as liquid crystal glass.

BRIEF DESCRIPTION OF DRAWINGS

FIG. 7 is a table showing an example in which the dynamic characteristics of the horizontal holding arm according to this embodiment adopting CFRP as a material of the horizontal holding arm with those of the conventional horizontal holding arm consisting of aluminium;

FIGS. 8A, 8B and 8C are views and a table in which the geometrical moment of inertia of the horizontal holding arm having a cross section like a channel is compared with that of the horizontal holding arm having a cross section like a top hat;

BEST MODE FOR CARRYING OUT THE INVENTION

Figure 2:
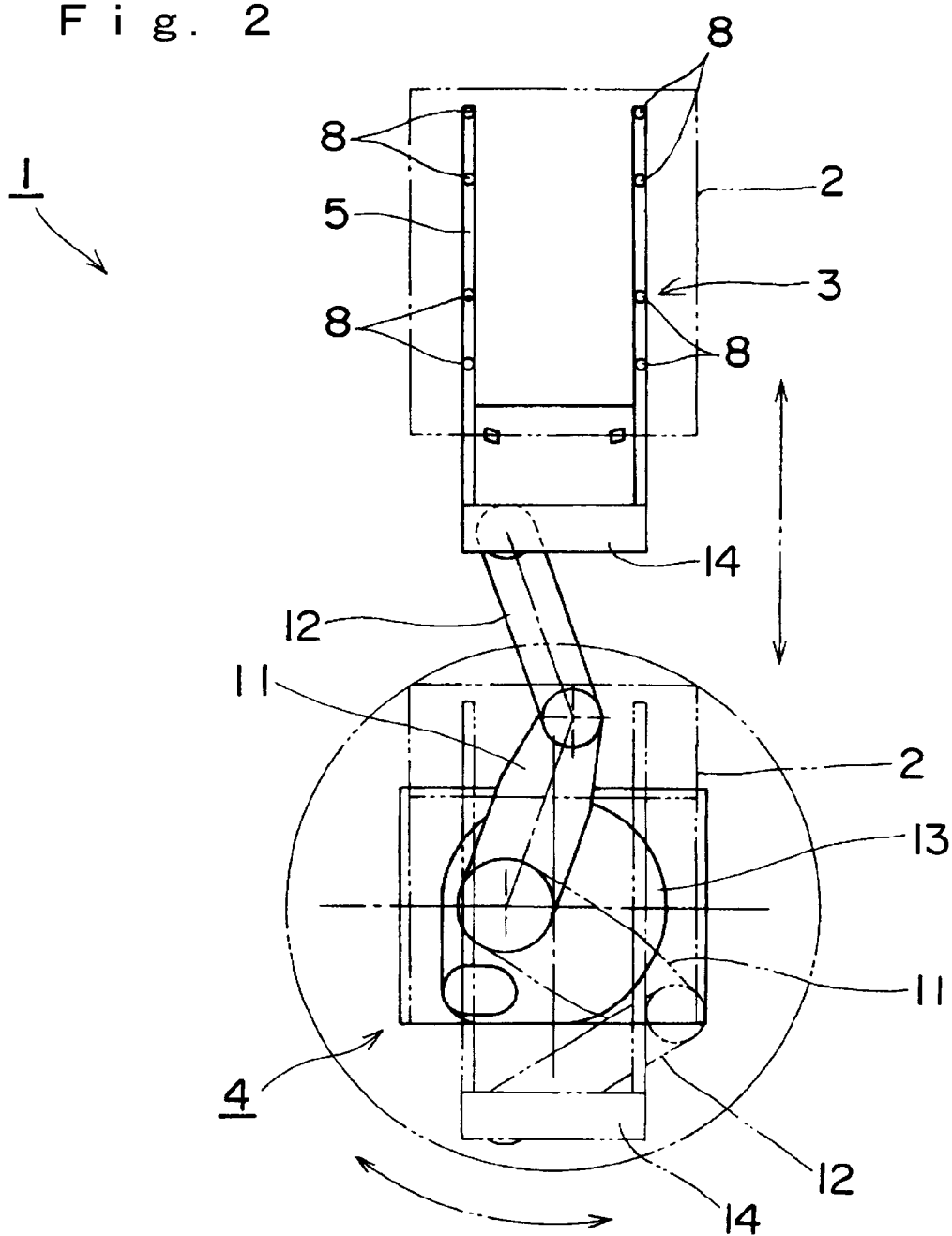
FIG. 2 is a plane view of a workpiece carrying apparatus.
Figure 3:
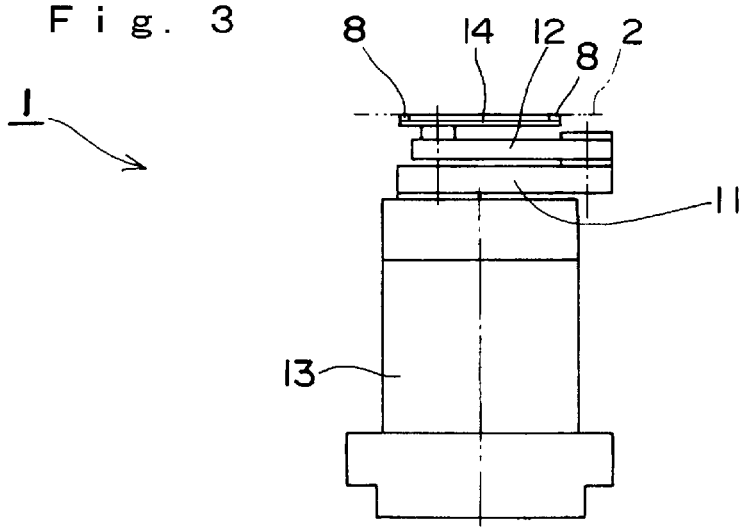
FIG. 3 is a front view of the workpiece carrying apparatus.
Figure 4:
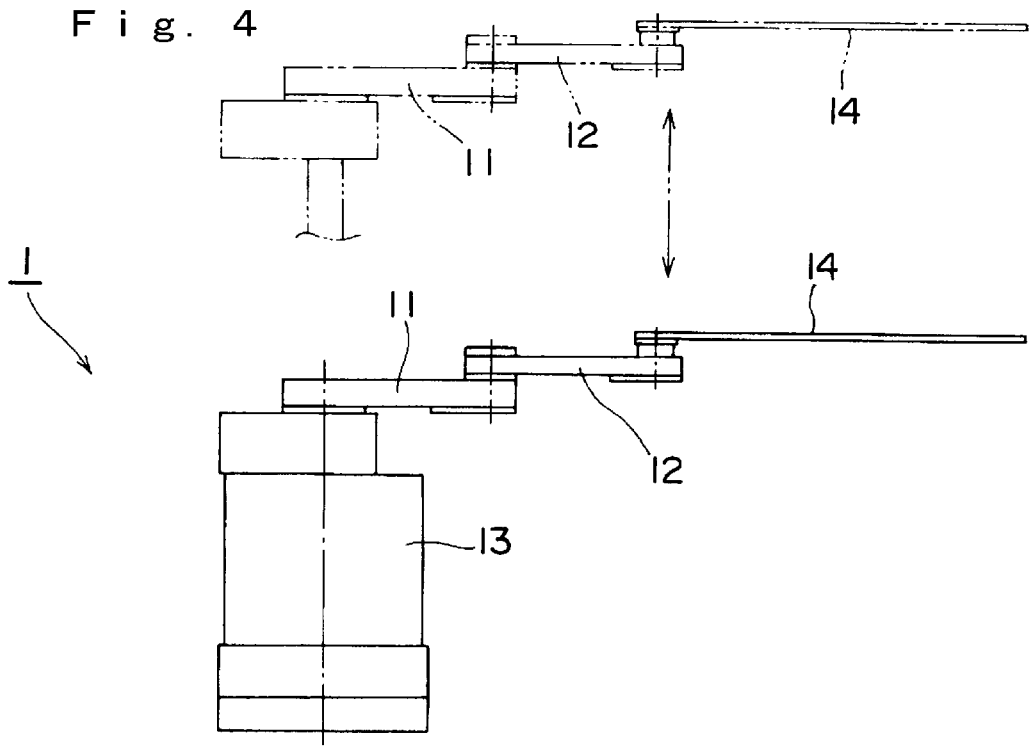
FIG. 4 is a side view of the workpiece carrying apparatus.
Figure 5:
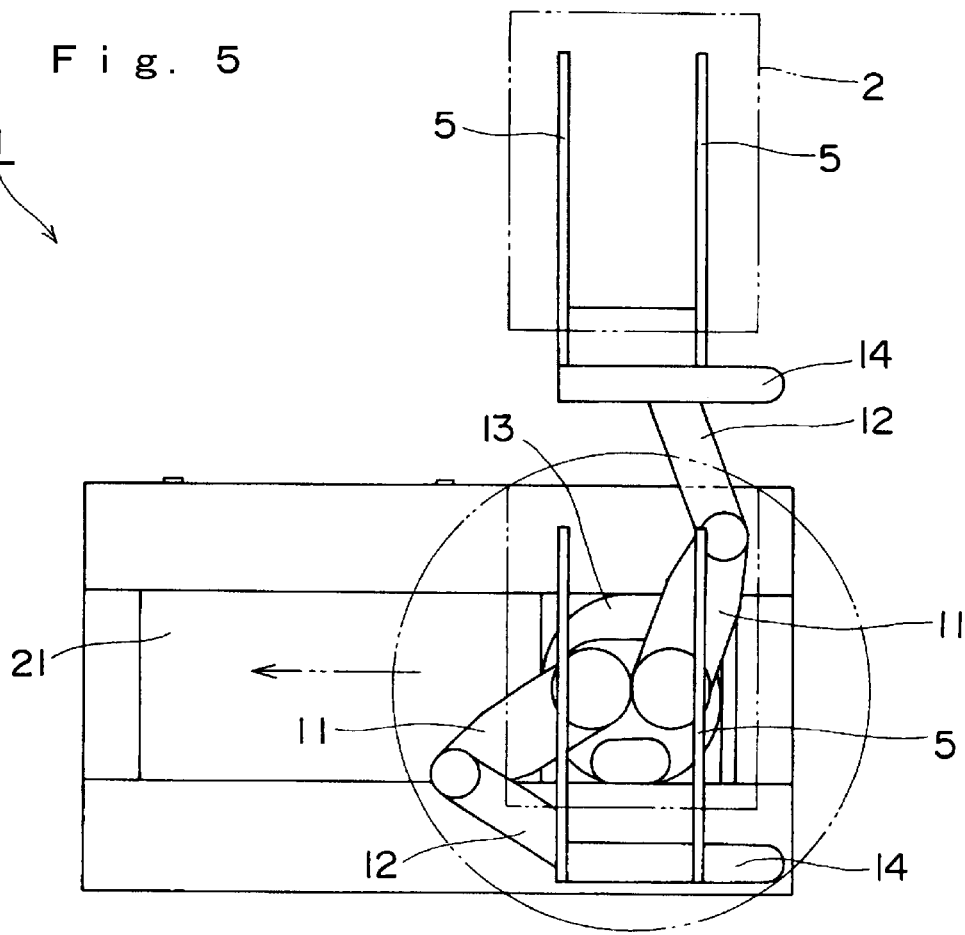
FIG. 5 is a plane view showing the workpiece carrying apparatus on a direct acting mechanism.

The structure of the present invention will now be described in detail based on an embodiment shown in the accompanying drawings. FIGS. 1 to 8 show an embodiment of a workpiece carrying apparatus according to the present invention. As shown in FIGS. 2 and 3, this workpiece carrying apparatus 1 includes a hand 14 for holding a workpiece 2, and a moving mechanism 4 for moving the hand 14 in the horizontal direction. The moving mechanism 4 includes a base 13, a first arm 11 capable of rotating on the base 13, and a second arm 12 rotatably attached to the end of the first arm 11. Further, the rotatable hand 14 is attached to the end of the second arm 12. The height of the part from the first arm 11 to the hand 14 can be adjusted by moving up and down the first arm 11 as shown in FIG. 4. Furthermore, the base 13 is mounted on a direct acting mechanism 21 shown in FIG. 5 and linearly moves. Moreover, when the hand 14 is rotated at the end of the second arm 12 without restraint, a desired workpiece 2 can be taken out or carried.

The hand 14 is provided with a workpiece holding portion 3 which is supported by a hand base portion and holds a workpiece 2. In this embodiment, the workpiece holding portion 3 is constituted by a pair of horizontal holding arms 5 which extend in parallel to each other in the horizontal direction and have the same height as shown in FIG. 2 or 4.

Figure 9:
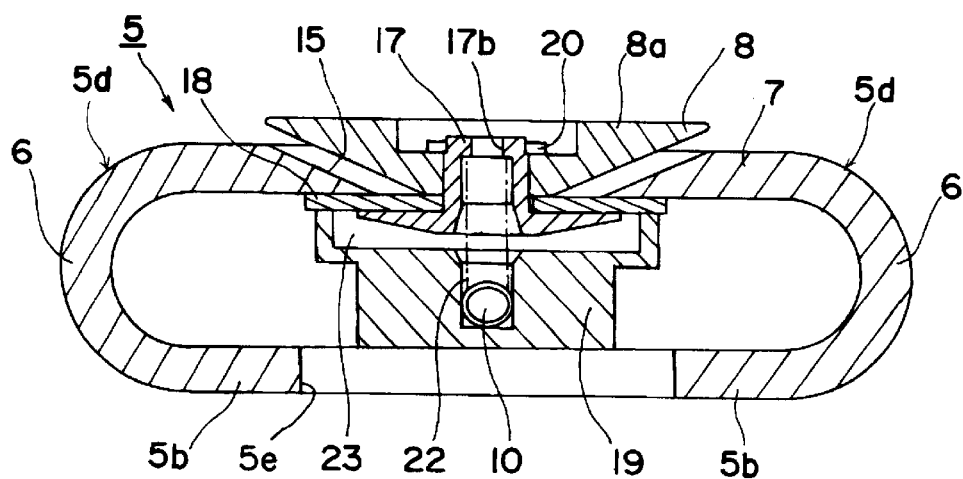
FIG. 9 is a transverse cross-sectional view of a horizontal holding arm showing another embodiment according to the present invention.
Figure 11:
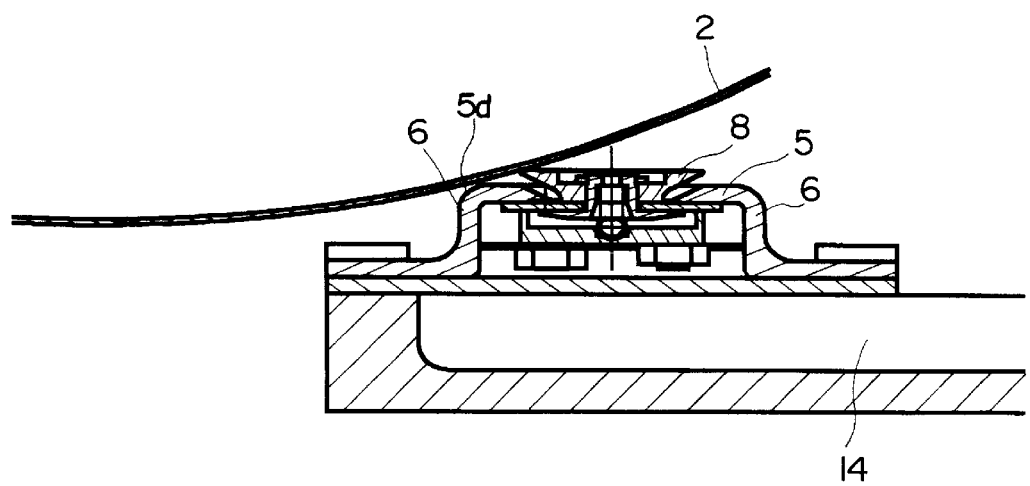
FIG. 11 is a view showing a deflected workpiece and the horizontal holding arm holding this workpiece.

Each horizontal holding arm 5 has a horizontal arm portion 7 consisting of a flat plane opposed to the workpiece 2 and at least one bent portion 6 which is bent in a direction crossing the horizontal arm portion 7, and a corner portion 5d on the border between the bent portion 6 and the horizontal arm portion 7, namely, the surface of the bent portion 6 on the workpiece side 2 is rounded. Here, although it is preferable that the bent portion 6 is bent so as to be orthogonal to the horizontal arm portion 7, it may be bent so as to be oblique or form a curved surface such as shown in FIG. 9 in some cases.

Figure 6:
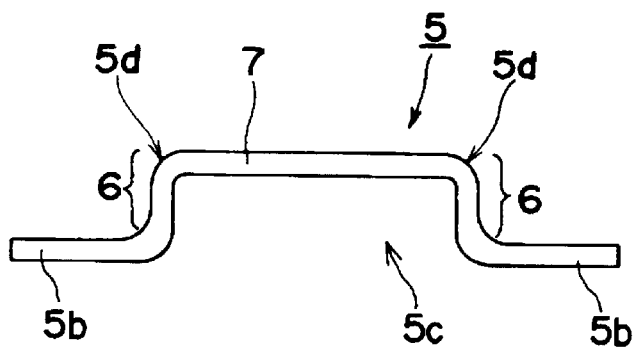
FIG. 6 is a view schematically showing the cross-sectional shape of the horizontal holding arm shaped like a high hat.

In addition, the horizontal holding arm 5 constituted by the horizontal arm portion 7 and at least one bent portion 6 can suffice. However, for example, the horizontal holding arm 5 including a flange portion 5b shaped like a channel as shown in FIG. 8A is preferable, and that including a flange portion shaped like a top hat such as shown in FIG. 6 or FIG. 8B is more preferable. The horizontal holding arm 5 shown in FIG. 6 or 8B has a shape for simultaneously forming the horizontal arm portion 7 and the bent portion 6 by causing the central portion in the widthwise direction to protrude upward. That is, the horizontal holding arm 5 has a groove shape having the horizontal arm portion 7 and the bent portions 6 extending from both sides of the horizontal arm portion 7 downward in the vertical direction.

Additionally, it is preferable that the end of the bent portion 6 on the side away from the horizontal arm portion 7 is bent outward or inward to be formed as a flange portion 5b. In the horizontal holding arm 5 shown in FIG. 6, the lower end sides of the bent portions 6 on the both sides are bent outward, thereby forming the flange portions 5b. Here, in the horizontal holding arm 5 shown in FIG. 6, each flange portion 5b is a horizontal plane bent in a direction orthogonal to the bent portion 6.

It is to be noted that the cross-sectional shape of the horizontal holding arm 5 is not necessarily restricted to one symmetrically having the bent portions 6 and the flange portions 5b on the both sides of the horizontal arm portion 7. For example, providing the bent portion 6 at least on one side can suffice. Further, the bent portion 6 does not have to be a plane parallel to the horizontal arm portion 7, and it may be one extending in, e.g., the oblique direction. However, the shape shown in FIG. 6 is preferable for increasing the geometrical moment of inertia of the horizontal holding arm 5 and obtaining the high flexural rigidity.

Furthermore, the horizontal holding arm 5 in this embodiment has a shape that the plane of the corner portion 5d on the border between the bent portion 6 and the horizontal arm portion 7 is rounded. In this manner, interference hardly occurs on the outer peripheral surface of the curve from the horizontal arm portion 7 to the bent portion 6 even if the workpiece 2 held by the two horizontal holding arms 5 is curved. Even if the workpiece is brought into contact with that surface, the surface of the workpiece 2 can be prevented from being damaged, and the static electricity is rarely generated on the liquid crystal glass as the workpiece.

Moreover, the horizontal holding arm 5 having the above-described shape has a space 5c consisting of a concave portion between the bent portions 6 on the back surface side of the horizontal arm portion 7. In this embodiment, members such as a holding mechanism 9 for holding a suction portion 8 and a sensor cable 27 are accommodated in this space 5c. The suction portion 8 is, for example, a suction cup which sticks fast to the surface of the workpiece 2 and holds it.

Figure 1:
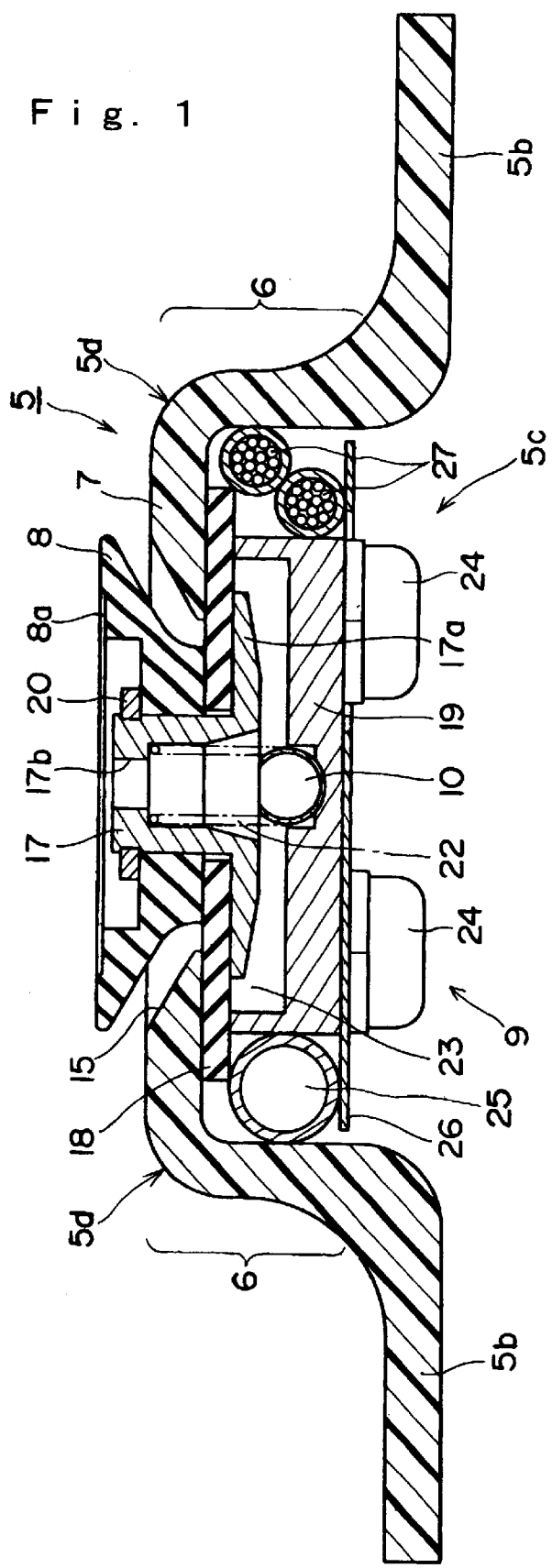
FIG. 1 is a transverse cross-sectional view of a horizontal holding arm shaped like a top hat showing an embodiment according to the present invention.

As shown in FIG. 1, in this embodiment, a through hole 15 is provided to the horizontal arm portion 7 so that the suction portion 8 can slightly protrude therefrom to the front side of the horizontal arm portion 7. Further, a holding mechanism 9 for holding the suction portion 8 and a suction pipe 10 which is connected with a non-illustrated vacuum source and sucks air from an air chamber 23 are accommodated on the back surface side of the horizontal arm portion 7. The through hole 15 is matched with a peripheral surface shape of the suction portion 8 provided in the hole, and formed by a cone-shaped inclined plane that the diameter of the lower part is smaller than that of the upper part as shown in FIG. 1.

Furthermore, in this embodiment, since a space 5c surrounded by the bent portion 6 on the back surface side of the horizontal arm portion 7 is opened, the operation for accommodating the suction portion 8, the holding mechanism 9, the sensor cable 27 and others can be easily performed.

The holding mechanism 9 is provided in order to hold the above-described suction portion 8 from the lower side, and it is constituted by a ventilation member 17, a support member 18, a sealing member 19, an engagement member 20, a suction pipe 10 and spring means 22 in this embodiment.

The ventilation member 17 is a cylindrical member provided with a flange portion 17a as shown in the drawing and fitted into the hole at the center of the suction portion 8 from the lower side. Moreover, when the suction portion 8 and the support member 18 are sandwiched by the engagement member 20 fitted in a tubular groove and the flange portion 17a, the ventilation member 17 is air-tightly brought into contact with the support member 18 to integrate these members. The ventilation member 17 has a ventilation hole 17b at the center thereof, and air in the concave portion 8a is taken in and out from this ventilation hole 17b to cause the negative pressure to act. A step portion for holding the end of the spring means 22 is provided in this ventilation hole 17b. The spring means 22 is provided between the ventilation member 17 and the sealing member 19 and constantly gives impetus to the suction portion 8 upwards through the ventilation member 17. Although a coil spring is used as this spring means 22 for example, any other spring means, e.g., a belleville-spring or a flat spring may be used to give impetus.

The support member 18 has a hole at the center and elastically supports the suction portion 8 and the ventilation member 17 fitted in this central hole. When this support member 18 is formed of silicon rubber, it has the elasticity such that the part on the inner peripheral side in the vicinity of the central hole rotates so as to move in the vertical direction or twist in the horizontal direction and inclination is changed in the front-and-back direction or the right-and-left direction. Also, the support member 18 can air-tightly come into contact with the flange portion 17a. Further, the support member 18 can also air-tightly come into contact with the sealing member 19.

The sealing member 19 is formed into a groove shape as shown in the drawing, and attached so as to hold the support member 18 from the lower side. Furthermore, the sealing member 19 air-tightly comes into contact with the support member 18 to form an air chamber 23. The sealing member 19 is screwed from the lower side by screws 24 and 24 which reach the horizontal arm portion 7 of the horizontal holding arm 5, and fixed to the horizontal holding arm 5 together with the support member 18 and others. Moreover, the sealing member 19 has a groove portion for installing the suction pipe 10 at the inner central portion thereof.

The holding mechanism 9 having such a structure can release air with the suction portion 8 being in contact with the lower surface of the workpiece 2, and suck the workpiece 2 by forming a negative pressure in the air chamber 23. At this moment, since the suction portion 8 and the support member 18 have the elasticity, the suction portion 8 can change the inclination of the suction plane in the front-and-back direction or the right-and-left direction. In addition, the suction portion 8 receives the upward force by the spring means 22. Therefore, granting that the workpiece 2 is curved, the suction portion 8 can entirely come into contact with the lower surface of the workpiece 2 to form a negative pressure in the air chamber 23. Additionally, when the support member 18 receives the weight of the workpiece 2 and a negative pressure is formed in the air chamber 23, the support member 18 is deflected downward, and the suction portion 8 and the ventilation member 17 drop downward. However, since they continuously receive the upward force by the spring means 22, they are not lowered beyond a predetermined position. Thus, it is possible to prevent the lower surface of the workpiece 2 from coming into contact with the horizontal arm portion 7 of the horizontal holding arm 5 and from being damaged. Further, the suction portion 8 which is elastically supported by the support member 18 and the spring means 22 which consist of elastic members absorbs the impact at the time of contact in order to suck the workpiece 2, and the surface of the workpiece 2 is not thereby damaged.

Furthermore, in this embodiment, in the space 5c of the horizontal holding arm 5 are provided an air pipe 25, a pipe holder 26 and others as well as the above-described holding mechanism 9. The air pipe 25 is supported from the lower side by the plate-like pipe holder 26 fixed to the lower surface of the sealing member 19. In case of providing such an air pipe 25, the suction pressure in the suction portion 8 can be controlled in two systems by setting the air pipe 25 separately from the suction pipe 10. Moreover, sensor cables 27 for transmitting a detection signal of the workpiece or the like are provided at a position symmetrical with respect to the air pipe 25 and similarly supported by the pipe holder 26.

Incidentally, a plurality of the through holes 15 and suction portions 8 are provided to the horizontal holding arm 5, and a laminated workpiece 2 can be sucked and held by a plurality of the suction portions 8 as shown in FIG. 2. In this case, the number or installation positions of the suction portions 8 are not specifically restricted, and they can be appropriately changed depending on the dimension or shape of the workpiece 2 as a target.

As described above, the horizontal holding arm 5 according to this embodiment forms the horizontal arm portion 7 protruding toward the workpiece 2 by forming the bent portion 6 in a direction away from the workpiece 2, and includes the space 5c on the back surface side of the horizontal arm portion 7. This space 5c is utilized to accommodate the holding mechanism 9 and others. In this case, it is preferable that the space 5c has a depth enabling the screw 24 to be accommodated from its head portion and has a shape such that the entire horizontal holding arm 5 can be thin as much as possible. By doing so, it is possible to enter a narrow gap between the superimposed workpieces 2 at intervals. In addition, granting that the lower part of the horizontal holding arm 5 is brought into contact with the upper surface of the workpiece 2, the surface of the workpiece 2 is hardly damaged if the head portion of the screw 24 does not protrude from the lower surface of the flange portion 5b.

Additionally, the horizontal holding arm 5 according to this embodiment includes the horizontal arm portion 7, the bent portions 6 and the flange portions 5b as mentioned above and has the high flexural rigidity. That is, the bent portions 6 are provided in the vertical direction on the both sides of the horizontal arm portion 7, and the horizontal holding arm 5 according to this embodiment having the horizontal flange portions 5b has the geometrical moment of inertia which is large for the cross-sectional area and the high flexural rigidity. In other words, a quantity of material used for the horizontal holding arm 5 is small and the entire weight can be reduced, which results in the synergistic effect that the uniformly distributed load caused by its own weight can be further reduced.

Incidentally, as shown in FIGS. 8A, 8B and 8C, it can be understood the geometrical moment of inertia can be increased by forming the flange portions 5b even if the cross-sectional area remains the same. Further, since the rigidity becomes high when a ratio of the horizontal arm portion 7 and the flange portion 5b is 1:1, a shape which is preferable for the strength can be obtained, but the present invention is not restricted thereto.

Here, in the light of the rigidity of the horizontal holding arm 6, a preferable shape is illustrated in FIG. 8. As shown in FIG. 8B, assuming that a width of the horizontal arm portion 7 is A and a width of the flange portion 5b is B, when the geometrical moment of inertia is calculated with the ratio of A:2B being changed, it can be understood that the geometrical moment of inertial becomes maximum and the rigidity becomes high with A:2B being 1:1, as shown in FIG. 8C. Incidentally, although the value (1913) of the geometrical moment of inertia of a top hat type shape shown in FIG. 7 is different from the value depicted in FIG. 8C, this difference is caused due to a small difference in dimension such as the R shape of the corner.

FIG. 9 shows an example of another embodiment indicating the structure of the present invention. It is to be noted that like reference numerals denote parts having the structure/principle which is basically the same as the structure described in connection with the above embodiment, thereby omitting their explanation.

It is characteristic that the horizontal holding arm 5 shown in FIG. 9 is formed by a hollow pipe whose cross section is elliptical. Specifically, the horizontal holding arm 5 includes a horizontal arm portion 7 whose central part in the widthwise direction is flat as shown in the drawing, and the both sides of the horizontal arm portion 7 constitute the bent portions 6 which are curved. In this case, the corner portion ad on the border between the horizontal arm portion 7 and the bent portion 6 is rounded by the circular shape of the bent portion 9 itself. Furthermore, a part of the bent portion 6 which is downwardly bent toward the inner side constitutes the flange portion 5b. In this embodiment, as shown in FIG. 9, end portions of the flange portions 5b on the both sides are connected, and the cross section forms an elliptical hollow pipe. It is to be noted that the ellipse in this specification is not restricted to the ellipse in the strict sense but includes an elongated oval.

Incidentally, although not shown, in the horizontal holding arm 5 whose cross section is hollow, thin and rectangular, the upper surface corresponds to the horizontal arm portion 7, the both side surfaces correspond to the bent portions 6, and the lower surface corresponds to the flange portions 5b. Moreover, the space 5c is formed at a part surrounded by the horizontal arm portion 7, the bent portions 6 and the flange portions 5b.

In this embodiment, as similar to the embodiment shown in FIG. 1, a through hole 15 is provided to the horizontal arm portion 7, and a suction portion 8 for sucking a workpiece 2 is caused to pass through this hole and protrude toward the front surface side. In addition, a holding mechanism 9 for holding the suction portion 8 and a suction pipe 10 are accommodated in the inner space 5c.

Incidentally, as shown in FIG. 9, a hole 5e is formed on the lower surface corresponding to the flange portions 5b, and the operation for installing the suction portion 8 or the like is carried out from this hole 5e. In this embodiment, the hole 5e is provided on the back surface side of the suction portion 8 or the like in accordance with the position at which the suction portion 8 or the like is set.

Additionally, an insertion member which can be housed in the hollow portion of the horizontal holding arm a on the base side is inserted and attached to the hand base portion to which the horizontal holding arm 5 is attached.

Further, the accuracy such as flatness of the horizontal holding arm 5 is improved while providing a shim or the like for adjustment at the fastening part of the hand base portion to which the horizontal holding arm 5 is attached.

If the horizontal holding arm 5 has such a closed shape as shown in FIG. 9, since the cross-sectional shape is rarely deformed as compared with the above-described embodiment (FIG. 1), a quantity of deflection at the end of the horizontal holding arm 5 is also smaller than that of the above-described embodiment (FIG. 1). Therefore, the embodiment shown in FIG. 9 is preferable as the large workpiece carrying apparatus 1 in which the horizontal holding arm 5 is elongated.

Incidentally, although the above has described the cross-sectional shape of the horizontal holding arm 5, the higher rigidity and further reduction in weight can be realized by appropriately selecting a material of the horizontal holding arm 5. For example, in the foregoing embodiment, a carbon fiber material (CFRP) is adopted as a material of the horizontal holding arm 5 so that reduction in weight can be achieved without deteriorating the strength as the workpiece holding portion 3. It is to be noted that, for example, FRP (fiber reinforced plastic) including GFRP (glass fiber reinforced plastic) can be also adopted in some cases.

Here, FIG. 7 shows an example of a result of comparison in dynamic characteristics between the horizontal holding arm 5 according to this embodiment in which the carbon fiber reinforced plastic (CFRP) is adopted as a material and a conventional aluminium horizontal holding arm. The length in the longitudinal direction, the width of the cross section and the height are equal in the both arms. In this case, it can be understood that the arm consisting of CFRP is superior in all characteristics as means for carrying the workpiece 2. For example, the arm consisting of CFRP has the Young's modulus (modulus of longitudinal elasticity) which is 2.5-fold or above of that of the arm consisting of aluminium, and a quantity of deflection of the CFRP arm caused due to its own weight is greatly reduced (not more than ¼).

Further, in case of adopting CFRP as a material in this manner, it is preferable to also consider the orientation of the fibers or coarseness and minuteness. That is, in such a member as the horizontal holding arm 5 according to this embodiment which is formed to be extended in the longitudinal direction, increasing the density of the fibers arranged in the longitudinal direction above that of the fibers arranged in the lateral direction orthogonal to the longitudinal direction is preferable for enhancing the flexural rigidity. Furthermore, the fibers may be arranged in the oblique direction to improve the rigidity.

In the workpiece carrying apparatus 1 according to this embodiment described above, the laminated workpiece 2 can be stably and assuredly carried by the horizontal holding arm 5, and a thick glass workpiece 2 or a workpiece 2 consisting of a material other than glass which has a weight can be also carried by providing the adequate strength to the horizontal holding arm a.

Moreover, even if the horizontal holding arm a is further extended, increase in weight of the workpiece holding portion 3 formed by this horizontal holding arm 5 can be suppressed and a quantity of deflection involved by increase in weight can be reduced. Therefore, even if the accommodation pitch of the workpiece 2 in the cassette is small, the workpiece 2 can be stably and assuredly moved, and the rectilinear movement property can be secured at the time of inserting or removing the workpiece holding portion 3.

In addition, since the workpiece holding portion 3 according to this embodiment is formed thin and the holding mechanism 9 or the like is accommodated on the back surface side of the horizontal arm portion 7, the surface of the workpiece 2 can be prevented from being damaged. Additionally, the corner portion 5d of the above-described horizontal holding arm 5 is rounded, and only the corner portion 5d comes into contact with the workpiece 2 even if the horizontal holding arm 5 is brought into contact with the workpiece 2. Therefore, a problem of damages to the workpiece 2 does not occur.

Further, CFRP is adopted as a material of the horizontal holding arm 5. Thus, when the horizontal holding arm 5 is molded so as to have a cross section shaped like a top hat, the mold which is divided in the vertical direction can be used for molding, and the molding operation itself can be facilitated. Furthermore, a quantity of material can be reduced in any embodiment described above, and it is possible to decrease the cost in the long term while taking labors required for adjustment for reducing a quantity of deflection into consideration.

Incidentally, although the above has described a preferred embodiment according to the present invention, the present invention is not restricted thereto. Various modifications can be carried out without departing from the scope of the invention. For example, the horizontal holding arm 5 described above can be applied to any workpiece carrying apparatus 1 which is of a single hand type shown in FIG. 2 or a double hand type shown in FIG. 5.

Figure 10:
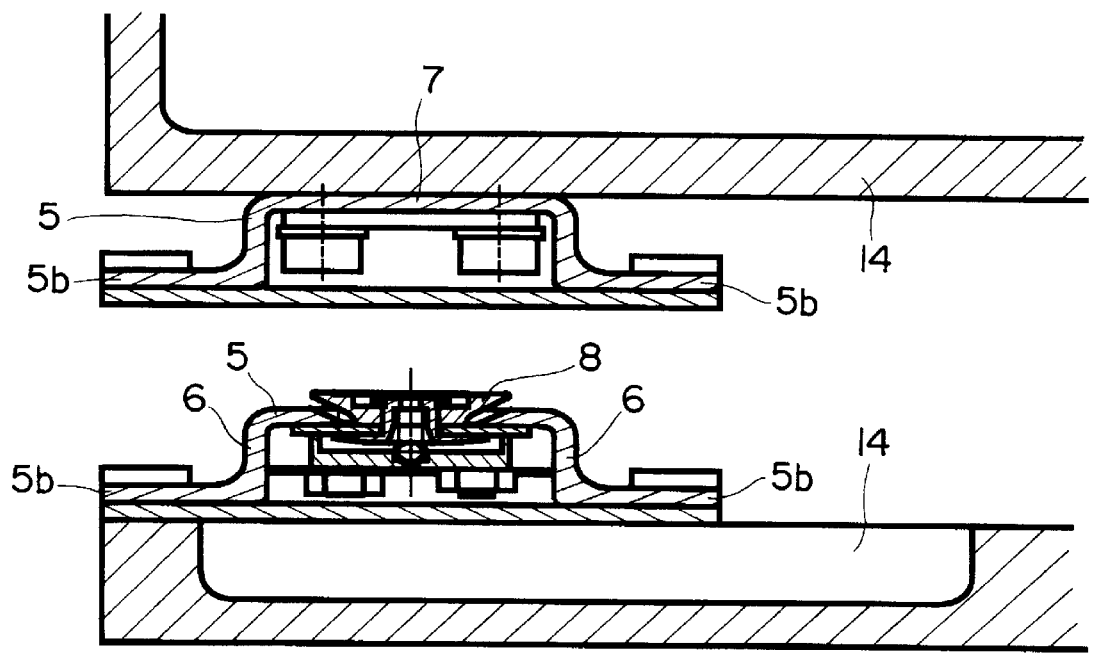
FIG. 10 is a view showing the horizontal holding arm attached to a hand base portion.

Moreover, although the horizontal holding arm 5 according to this embodiment has a shape including the flange portions 5b, it is possible to form the groove-like cross section such as shown in FIG. 8A in which no flange portion 5b is provided. However, since the horizontal holding arm 5 according to this embodiment includes the flange portions 5b at a position lower than that of the suction portion 8, the rigidity can be increased, and the possibility of contact with the workpiece 2 can be reduced. Also, attachment to the base portion of the hand 14 is facilitated. That is, for example, by utilizing this flange portion 5b, a screw can be inserted into a non-illustrated screw hole provided to the flange portion 5b shown in FIG. 10 so that the horizontal holding arm 5 can be attached to the base portion of the hand 14. Alternatively, by utilizing the horizontal arm portion 7, the horizontal holding arm 5 can be attached to the lower side of the base portion of the hand 14 as shown in FIG. 10. Further, when the vertical horizontal holding arms 5 and 5 are attached to the double hand type workpiece carrying apparatus 1 in such a manner that the horizontal holding arms 5 and 5 are inverted so as to be set back to back, this attachment can be facilitated by utilizing the flange portion. Therefore, in case of forming the horizontal holding arm 5 into a groove-like shape having no flange portion 5b, the flange portion for attachment may be provided to only the attachment portion of the base portion of the hand 14. Furthermore, a reinforcement member may be superimposed on the flange portion 5b and then attached to the hand base portion.

Figure 12:
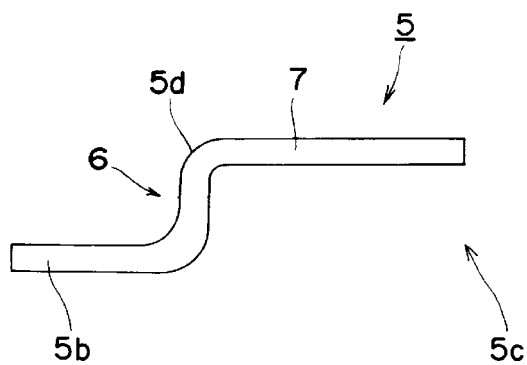
FIG. 12 is a schematic view showing the horizontal holding arm having another shape.
Figure 13:
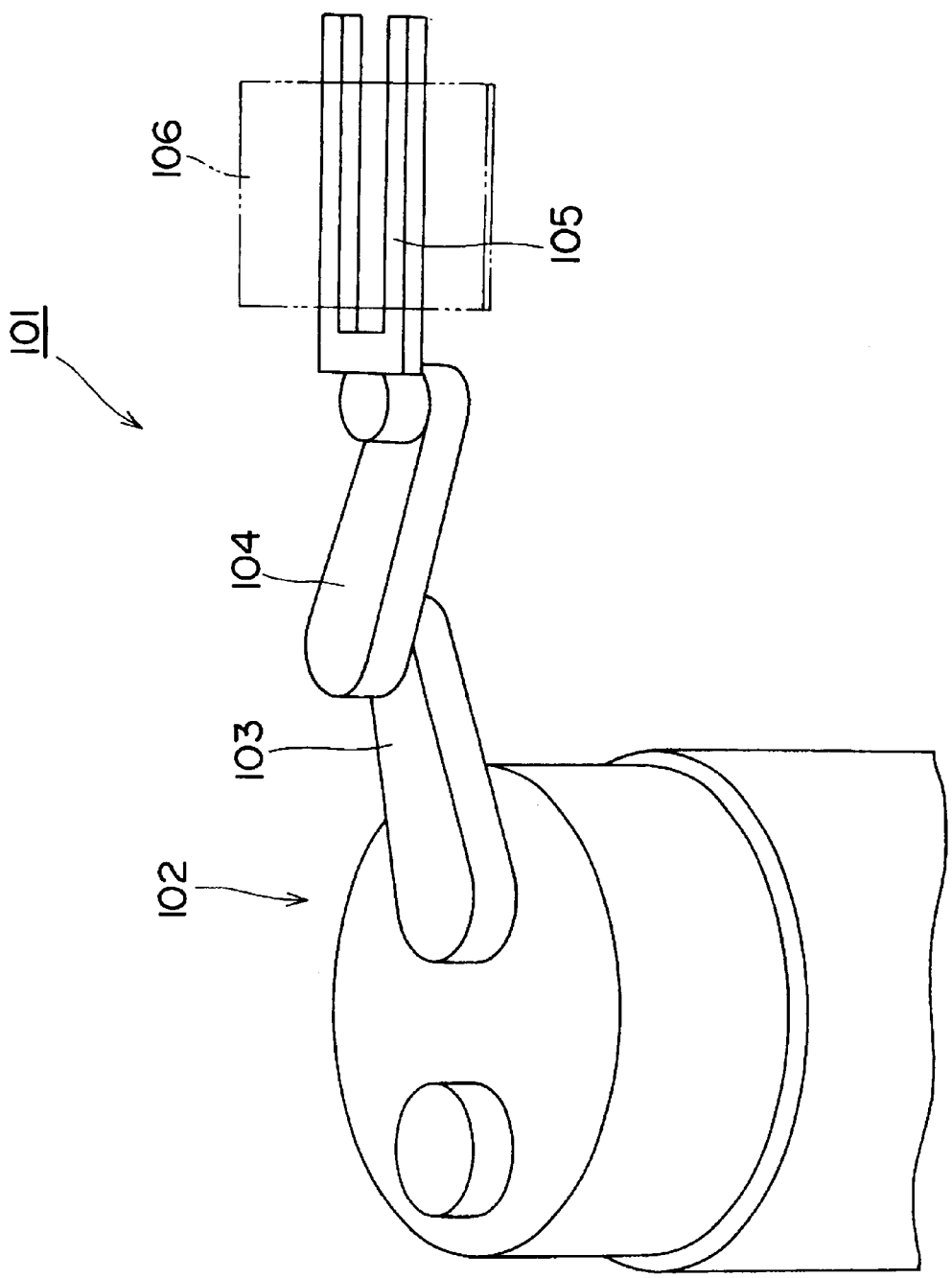
FIG. 13 is a perspective view showing a conventional workpiece carrying apparatus.

Moreover, although the above has mainly described the embodiment of the horizontal holding arm 5 having the bent portions 6 on the both sides, the horizontal holding arm portion 5 having at least one bent portion 6 can suffice, and its shape does not have to be symmetrical. For example, as shown in FIG. 12, the horizontal holding arm 5 may have a crank-shaped cross section or a Z-shaped cross section in which one horizontal arm portion 1 and one flange portion 5b are connected to each other through the bent portion 6. The flange portion 5b is outwardly bent on the opposite side to the horizontal arm portion 7. In case of the shape shown in FIG. 12, its geometrical moment of inertia is larger than that of the groove-shaped horizontal holding arm 5 shown in FIG. 8A and the flexural rigidity is also higher than that of the same. Alternatively, although not shown, the flange portion 5b may be bent toward the same side as the horizontal arm portion 7, namely, the inner side. In this case, the horizontal holding arm 5 has a channel-shaped cross section, the geometrical moment of inertia is increased and the high flexural rigidity a can be obtained. In addition, the holding mechanism 9 and others are accommodated in the open space 5c having two planes partitioned by the horizontal arm portion 7 and one bent portion 6 as similar to each of the foregoing embodiments, and the suction portion 8 is provided so as to slightly protrude from the horizontal arm portion 7.

What is claimed is:

1. A workpiece carrying apparatus comprising a hand for holding a workpiece and a moving mechanism for moving said hand in a horizontal direction, wherein a workpiece holding portion of said hand is formed by a horizontal holding arm extending in the horizontal direction and consisting of a carbon fiber material, said horizontal holding arm has a horizontal arm portion being opposed to said workpiece and at least one bent portion being bent in a direction crossing said horizontal arm portion, a surface of a corner portion on a border between said bent portion and said horizontal arm portion being rounded, a suction portion for sucking said workpiece protruding on a front surface side of said horizontal arm portion, and a holding mechanism for holding said suction portion and a suction pipe being accommodated on the back surface side of said horizontal arm portion.

2. The workpiece carrying apparatus according to claim 1, wherein said horizontal holding arm has said bent portion on each side of said horizontal arm portion.

3. The workpiece carrying apparatus according to claim 1, wherein said horizontal holding arm has a flange portion being further bent on a side of said bent portion opposite to said horizontal arm portion.

4. The workpiece carrying apparatus according to claim 3, wherein said flange portion is outwardly bent.

5. The workpiece carrying apparatus according to claim 2, wherein said holding mechanism is accommodated in a space consisting of a concave portion formed between said bent portions on the back surface side of said horizontal arm portion.

6. The workpiece carrying apparatus according to claim 1, wherein said workpiece is a laminated plate material, said horizontal arm portion is provided with a plurality of said suction portions, and said laminated plate material is sucked and held by a plurality of said suction portions.

7. A workpiece carrying apparatus comprising a hand for holding a workpiece and a moving mechanism for moving said hand in a horizontal direction, wherein a workpiece holding portion of said hand is formed by a horizontal holding arm extending in the horizontal direction and consisting of a carbon fiber material, said horizontal holding arm has a horizontal arm portion being opposed to said workpiece and at least one bent portion forming a curved surface and being connected to said horizontal arm portion, said horizontal holding arm having a transverse cross section being hollow and elliptical, the horizontal arm portion including suction portions.

* * * * *